United States Patent

Bauerlein et al.

[15] 3,691,376

[45] Sept. 12, 1972

[54] METHOD OF INCREASING THE CURRENT AMPLIFICATION AND THE RADIATION RESISTANCE OF SILICON TRANSISTORS WITH SILICON OXIDE COVER LAYER

[72] Inventors: Rudolf Bauerlein; Dieter Uhl, both of Erlangen, Germany

[73] Assignee: Siemens Aktiengesellschaft, 3, Berlin, Munich, Germany

[22] Filed: Jan. 29, 1970

[21] Appl. No.: 6,724

[30] Foreign Application Priority Data

Jan. 31, 1969 Germany..........P 19 04 763.3

[52] U.S. Cl...........250/49.5 TE, 250/42, 250/49.5 R

[51] Int. Cl...........................H01j 37/00, G01n 23/00

[58] Field of Search......29/576, 584; 250/42, 49.5 R, 250/49.5 TE, 49.5 T; 330/33

[56] References Cited

UNITED STATES PATENTS 3,193,678 7/1965 Damask....................250/49.5

OTHER PUBLICATIONS

" Electron Beam Control of FET Characteristics" by A. J. Speth from IBM Technical Disclosure Bulletin, Vol. 8, No. 4, Sept., 1965, pgs. 638- 639.

*Primary Examiner*—William F. Lindquist
*Attorney*—Curt M. Avery, Arthur E. Wilfond, Herbert L. Lerner and Daniel J. Tick

[57] ABSTRACT

Method of increasing the current amplification and the radiation resistance of silicon transistors having a silicon oxide cover layer. The transistor is first exposed to an ionizing X-ray, gamma or electron radiation of such energy that the silicon oxide layer is penetrated by at least a portion of the radiation, and of a dose between $10^4$ and $10^9$ rad. The transistor is subsequently subjected to an electric charge, without radiation effect whereby a blocking-layer temperature of about 50° to 250° C. occurs, and the sequence of irradiation and electric charges without radiation is repeated at least once.

8 Claims, 3 Drawing Figures

METHOD OF INCREASING THE CURRENT AMPLIFICATION AND THE RADIATION RESISTANCE OF SILICON TRANSISTORS WITH SILICON OXIDE COVER LAYER

Earth satellites and other space vehicles are subjected during their use to the effect of particle and quantum radiation. For example, within the radiation belt of the earth, the so-called "Van Allen" belt occurs, a penetrating protons and electrons radiation. The transistors used in such space vehicles are particularly threatened by this radiation since the electrical characteristics of the transistors are changed by the ionization which occurs during the action of the radiation. The current amplification of the transistors in particular may become strongly reduced under the action of radiation. Similar conditions can occur when transistors are used in particle accelerators, nuclear reactors, X-ray installations and other facilities where ionized radiation occurs. In order to prevent a reduction in the functioning of circuits equipped with transistors from becoming too strong, the transistors should possess the highest possible radiation resistance. A current amplification, which is as high as possible, can also be appropriate for transistors whose surrounding is not threatened by radiation. The highest possible current amplification is desired for transistors used in electronics in the range of microwatt output, i.e., at very low collector currents, in the order of magnitude of 1 $\mu$A.

Our invention has among its objects the devising of a method which affords an increase in the current amplification and the radiation resistance of silicon transistors provided with a silicon oxide cover layer.

According to our invention, the transistor is subjected to an ionizing X-ray, gamma or electron radiation of such energy that the silicon oxide cover layer is penetrated by at least a portion of the radiation, and exposed to a dose between $10^4$ and $10^9$ rad and subsequently subjected without the effect of radiation, to an electric charge whereby a barrier layer temperature of about 50° to 250° C. occurs and the sequence of radiation and of electrical charge without radiation effect, is repeated at least once.

It is known as such that in silicon planar transistors, the reduction in current amplification, which occurs during the action of an ionizing radiation, can in many cases, either partially or fully, be remedied through an electric charge, subsequent to the effect of radiation, particularly at the emitter-base junction of the transistor, in forward direction. It is, however, a complete surprise to find that a repeated sequence of radiation and electric charge constitutes not only a remedy for the reduction in current amplification caused by the first radiation but furthermore results in a considerable increase of the current amplification which can be obtained. This current amplification exceeds the value which is available prior to the first radiation. This effect is particularly prominent at small collector currents. By current amplification, we understand the static current amplification, i.e., the quotient from collector current and base current, which constitutes the most important characteristic magnitude of a transistor.

While heretofore the aim was to avoid, if possible, the irradiation of transistors in order not to reduce the current amplification, the method of the present invention uses a repeated irradiation of the transistor, alternating with electric charge without radiation, so as to obtain thereby an increase in the current amplification. At the same time, the method of the invention improves the radiation resistance of the transistors. This results in the fact that although the current amplification sinks while irradiation is carried out according to the method of the invention , it sinks only to a value which is considerably higher than the value to which the current amplification of the transistor would be reduced if irradiated with the same dose, prior to the performance of the present method.

The energy of the radiation used depends on the thickness of the silicon oxide cover layer of the transistor and, if radiation is carried out in a closed housing, it also depends on the thickness of the transistor housing. The energy is selected according to the known range-energy relation so that the silicon oxide cover layer is penetrated by at least a portion of the radiation. This results in the fact that the radiation acts almost uniformly within the entire thickness of the silicon oxide cover layer. The radiation dose must be between $10^4$ and $10^9$ rad, since the effect obtained by the invention does not occur at a smaller dose while a greater dose may lead to irreversible changes and possibly also to undesirable volume impairment. The latter is particularly caused by the production of defects in the bulk silicon material of the transistor. A radiation dose of $10^6$ to $10^8$ is preferably used.

The electric charge without radiation effect, depends in particular on the electrical characteristics of the transistors to be treated. The charge is so selected that a barrier layer temperature of about 50° to 250° C. occurs. The intended effect is not obtained at lower barrier layer temperatures, while at higher barrier layer temperatures, an impairment or destruction of the transistor can be expected. Preferably, the electric charge is effected in a manner whereby a barrier layer temperature between about 80° and 160° C. occurs. This temperature range affords, firstly, a relatively quick recovery from the radiation damages while, secondly, no impairment to the transistor need be feared from temperature. The duration of the individual electric charge without radiation effect, depends on the qualities of the transistor to be treated and on the selected barrier layer temperature and can last from about 15 minutes up to 2 days.

In order to effect an electric charge in a silicon planar-transistor, it is preferable to apply an additional electric voltage, in forward direction, between emitter and base contact and between emitter and collector contact, or the base and collector contact. These voltages are preferably so applied that the collector-base p-n junction of the transistor is charged in blocking direction.

The method of the invention which is preferably used for silicon planar transistors is also suitable for other silicon transistors with a silicon oxide cover layer, for example for MOS (metal oxide silicon) field effect transistors.

The invention will be described in greater detail with reference to the drawing and embodiment examples, wherein.

Figure 1:
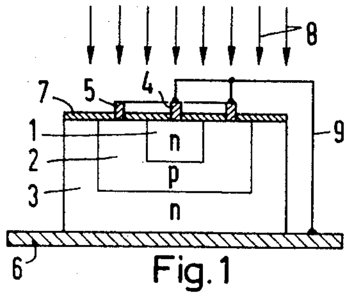
FIG. 1 shows a schematic illustration of an npn silicon planar transistor during irradiation according to the invention.

The npn silicon planar transistor of FIG. 1 has an N-conducting emitter region 1, a p-conducting base region 2 and an n-conducting collector region 3. The emitter region 1 is contacted with a metallic contact 4, the base region 2 is contacted with an annular metallic contact 5 and the collector region 3 is contacted with a wafer-shaped metallic contact 6. That surface of the transistor which contains the emitter contact and the base contact, is covered with a $SiO_2$ insulation layer 7.

During the first method step, the transistor surface, which is coated with the $SiO_2$ layer 7, was irradiated with electrons, accelerated by an electrical voltage and indicated by arrows 8, at an energy of about 100 keV for such time until a radiation dose of about $10^7$ rad was obtained. The radiation energy was such, that the predominant portion of the radiation could penetrate the $SiO_2$ layer 7, whose average thickness is about 0.5 micron. Contacts 4, 5 and 6 were short-circuited during irradiation via connecting leads 9. The transistor housing, not shown in the FIG., was opened for irradiation which was carried out under vacuum.

Figure 2:
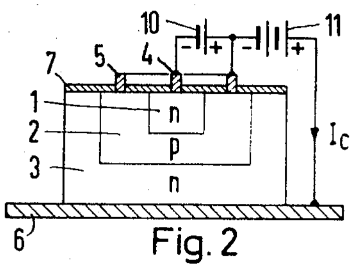
FIG. 2 shows a schematic illustration of an npn silicon planar transistor during the electric charge without radiation effect, according to the invention.

Following the irradiation, the second method step, i.e., the electric charge of the transistor, was effected in an atmosphere of dry nitrogen, also with the housing open. To this end, electric voltages were applied to contacts 4, 5 and 6 with the aid of DC voltage sources 10 and 11, seen in schematic illustration in FIG. 2 so that the emitter, base junction was poled in the forward direction and a collector current $I_C$ of about 0.3 A flowed from the collector 3, via base 2, to the emitter 1. The voltage between the collector contact 6 and the emitter contact 4, has approximately 5.7 V. The voltage between the emitter contact 4 and the base contact 5 was about 0.8 V. The collector base p-n junction is poled thereby, in blocking direction.

From this electric charge results by calculation a temperature for the collector base blocking or inverse layer of approximately 150° C. This value is obtained as a collector base blocking layer temperature from e the output converted by the transistor, when the thermal resistance of the transistor housing and the housing temperature (almost room temperature) is considered. At the relatively high collector current of about 0.3 A, the surface temperature across the emitter region of the transistor, which is determined by the electricity output converted in the path resistances of the emitter region and the base region as well as by the emitter-base p-n junction, is probably higher than the calculated value.

Following an electric charging for about 1 hour, the transistor was again subjected to irradiation by electrons, as described above. Following this irradiation, the transistor was again charged with electricity as described above. This electric charging was followed by other sequences of irradiation and electrical charges.

Figure 3:
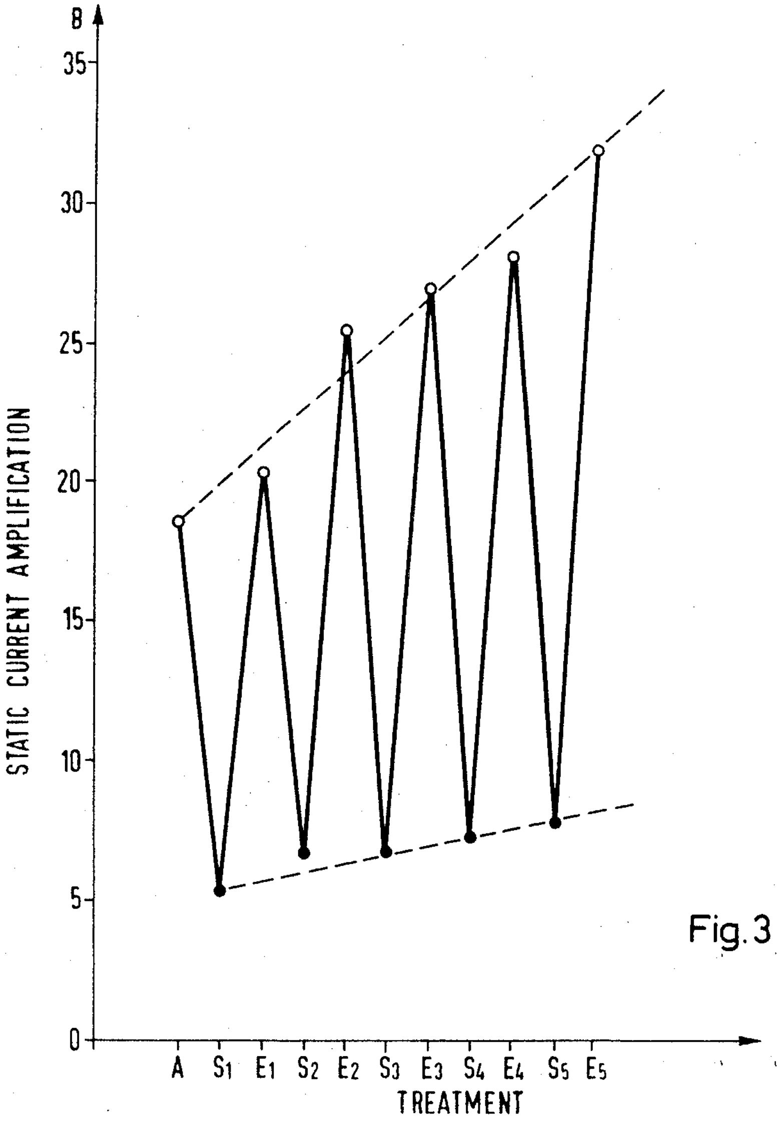
FIG. 3 shows median values, established by measuring several same type npn silicon planar transistors, for static current amplification, following irradiation or electrical charging, according to the method of the invention.

After each irradiation, respectively each electrical charge, the static current amplification B was measured at a collector current of 10 $\mu$ A and a collector base voltage of 2 V. The relatively low collector current was selected for these measurements since the effect of the irradiation upon the current amplification is easier to observe when the collector currents are low. The median values for the current amplification B which were determined for a plurality of planar transistors of the same type and subjected to the same treatment, are shown in FIG. 3, according to individual method steps. The current amplification is plotted on the ordinate, while the abscissa shows the individual method steps. A designates the initial state prior to the performance of the present method, $S_1$ to $S_5$ depicts the condition following five sequential irradiations, while $E_1$ to $E_5$ denotes the condition following the five electrical charges, without radiation effect, which followed each respective irradiation.

FIG. 3 shows plainly that a repeated performance of a sequence of irradiation and electrical charging can increase the current amplification considerably. For example, the current amplification which for initial state A was about 18.6 rose following the fifth electric charge, i.e., state $E_5$, to about 32.0, i.e., to approximately 1.7 times of the current amplification during the initial state A. The increase in current amplification can be plainly traced to the sequence of irradiation and electric charges. The electricity charge alone does not result in an increase in current amplification, as pretests have shown.

The obtained improvement in the radiation resistance of transistors obtained through the method of the invention, is clearly shown by FIG. 3. While current amplification decreased through the first irradiation, i.e., in state $S_1$, to a value of 5.3, current amplification was reduced following the fifth irradiation, i.e., in state $S_5$, only to about 7.8. Hence, following the fifth irradiation, the current amplification amounted to approximately 1.5 times the current amplification after the first irradiation.

To replace nitrogen, electrical charging can also be effected, at an open transistor housing, under another protective gas, such as argon, or even on air. The method of the invention can preferably be carried out also at a closed housing, as a final processing step during the production process of a transistor.

As a modification of the aforedescribed embodiment example, the transistor can also be charged with electricity, during irradiation.

Especially under certain circumstances, it is not necessary to omit the electric charge which is applied without radiation effect, during the subsequent irradiation. The important factor is only that a phase with a radiation effect be followed by a phase of electrical charging without radiation effect.

In addition to electron radiation, the method of the invention can also employ X-ray or gamma rays. The same dose of radiation will produce the same effects, with these rays. Radioactive sources of isotopes can also be used as sources of radiation.

We claim:

1. A method of increasing the current amplification and the radiation resistance of silicon transistors with a silicon oxide cover layer, which comprises exposing the transistor to an ionizing X-ray, gamma or electron radiation of such energy that the silicon oxide cover layer is penetrated by at least a portion of the radiation, and of a dose between $10^4$ and $10^9$ rad, subsequently subjecting the transistor to an electric voltage, without radiation, in the forward direction between the emitter and base contact and applying an additional electrical voltage between emitter and collector contacts whereby a blocking layer temperature of about 50° to 250° C. occurs, and repeating at least one sequence of irradiation and electric voltage application without radiation.

2. The method of claim 1, wherein a radiation dose of $10^6$ to $10^8$ rad is used.

3. The method of claim 1, wherein the electric voltage result in a blocking layer temperature between about 80° and 160° C.

4. The method of claim 1, wherein the applied voltage causes the collector base p-n junction of the transistor to be poled in the blocking direction.

5. A method of increasing the current amplification and the radiation resistance of silicon transistors with a silicon oxide cover layer, which comprises exposing the transistor to an ionizing X-ray, gamma or electron radiation of such energy that the silicon oxide cover layer is penetrated by at least a portion of the radiation, and of a dose between $10^4$ and $10^9$ rad, subsequently subjecting the transistor to an electric voltage, without radiation, in the forward direction between the emitter and base contact and an additional electrical voltage is applied between the base and collector contacts, whereby a blocking layer temperature of about 50° to 250° C. occurs, and repeating at least one sequence of irradiation and electric voltage applications without radiation.

6. The method of claim 5, wherein a radiation dose of $10^6$ to $10^8$ rad is used.

7. The method of claim 6, wherein the electric voltage result in a blocking layer temperature between about 80° and 160° C.

8. The method of claim 5, wherein the applied voltage causes the collector base p-n junction of the transistor to be poled in the blocking direction.

* * * * *